(12) United States Patent
Dieny et al.

(10) Patent No.: US 7,944,736 B2
(45) Date of Patent: May 17, 2011

(54) MAGNETORESISTIVE DEVICE

(75) Inventors: Bernard Dieny, Lans En Vercors (FR); Virgile Javerliac, Fontaine (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 186 days.

(21) Appl. No.: 11/989,380

(22) PCT Filed: Jul. 26, 2006

(86) PCT No.: PCT/EP2006/064671
§ 371 (c)(1), (2), (4) Date: Oct. 7, 2008

(87) PCT Pub. No.: WO2007/014888
PCT Pub. Date: Feb. 8, 2007

(65) Prior Publication Data
US 2009/0135526 A1 May 28, 2009

(30) Foreign Application Priority Data

Jul. 27, 2005 (FR) ...................................... 05 08001

(51) Int. Cl.
*G11B 5/33* (2006.01)
(52) U.S. Cl. ..... 365/158; 365/171; 360/314; 360/324.2; G9B/5.104

(58) Field of Classification Search ............... G9B/5.104
See application file for complete search history.

(56) References Cited

U.S. PATENT DOCUMENTS

| 7,120,048 | B2 * | 10/2006 | Sundstrom ..................... 365/158 |
| 2003/0169147 | A1 * | 9/2003 | Higo .......................... 338/32 R |
| 2005/0018479 | A1 | 1/2005 | Uesugi et al. | |
| 2006/0215443 | A1 * | 9/2006 | Katti ............................ 365/158 |

* cited by examiner

*Primary Examiner* — Huan Hoang
*Assistant Examiner* — James G Norman
(74) *Attorney, Agent, or Firm* — Weingarten, Schurgin, Gagnebin & Lebovici LLP (57) ABSTRACT

The device comprises two magnetoresistive elements (10, 20) placed relative to each other in magnetostatic interaction in such a manner that a magnetic flux passing between these elements (10, 20) closes through soft ferromagnetic layers (26, 27) of said elements (10, 20). A write device (15) is associated with the elements (10, 20) to control the magnetization of each soft layer (26, 27). A read conductor line (11, 12, 13, 14) is associated with each magnetoresistive element (10, 20) to detect the magnetic state of the soft layer (26, 27) by measuring the corresponding magnetoresistance. The soft ferromagnetic layers (26, 27) of the elements (10, 20) remain oriented substantially in antiparallel relative to each other, while the hard ferromagnetic layers (24) of said elements (10, 20) are oriented substantially in parallel.

19 Claims, 6 Drawing Sheets

MAGNETORESISTIVE DEVICE

This application is a §371 national phase filing of PCT/EP2006/064671 filed Jul. 26, 2006, and claims priority to French application No. 05 08001 filed Jul. 27, 2005.

The present invention relates to a magnetoresistive device comprising at least one pair of magnetoresistive elements comprising first and second magnetoresistive elements, each comprising at least a hard ferromagnetic layer that is trapped in a permanent direction and serves as a reference layer, and a soft ferromagnetic layer separated from the hard ferromagnetic layer by a separator layer, the soft layer being made for each of the first and second magnetoresistive elements in such a manner as to present two stable magnetic states.

STATE OF THE PRIOR ART

Numerous spintronic applications, and in particular memories or logic elements, make use of stacks of magnetoresistive layers comprising at least two ferromagnetic layers separated by a non-magnetic layer. One of the ferromagnetic layers is trapped in a permanent direction and serves as a reference layer, while the magnetization of the other layer can be switched relatively easily by an applied field.

Such stacks may constitute magnetic tunnel junctions when the separator layer is insulating, or so-called spin valve structures when the separator layer is made of metal. In such structures, the electrical resistance varies as a function of the relative orientation of the magnetizations of the two ferromagnetic layers. In most cases, the resistance is at a minimum when the magnetizations are parallel and at a maximum when the magnetizations are antiparallel.

Spin valves (invented in 1999 by Dieny et al.) and magnetic tunnel junctions (which led to a first tunnel magnetoresistance operating at 300 K in 1995 by Moodera et al. and also Miazaki et al.) are basic elements for numerous spintronic devices.

Spin valves have been used since 1998 in computer hard disks, while tunnel junctions are storage elements for a new type of non-volatile magnetic memory known as magnetic random access memory (MRAM). MRAMs have been the subject of intense research and development (R&D) since 1997 and should be appearing on the market in the near future.

In addition to MRAMs, a major field of applications for such devices is the field of logic. It is thus possible to design logic gates or other logic elements (conversion or look-up tables (LUTs), locking circuits, . . . ) making use of tunnel junctions or spin valves. Such elements benefit from the non-volatile nature of the information processed thereby, and from the way in which a gate can be reprogrammed, i.e. its function can be changed (e.g. an AND gate can be transformed into a NOR gate by using control signals). Although MRAMs have been the subject of a large amount of study since 1997, the amount of work devoted to magnetic logic has been much less.

In many memory or logic elements, the operation of the device relies on differential detection between one or more reference magnetoresistive elements and magnetoresistive elements through which information passes during processing. For example, in an MRAM chip, the resistance state of a tunnel junction (high resistance if the magnetic configuration is antiparallel and low resistance if the magnetic configuration is parallel) is determined by comparing the resistance of said junction with the resistance of a reference junction constituted by the stack of layers that is identical except that the magnetizations of the trapped layer and of the soft layer are oriented at approximately 90° relative to each other, thus providing an intermediate level between the minimum resistance state and the maximum resistance state of the junction.

For numerous memory or logic devices, it can be advantageous to omit relying on specific reference elements.

SUMMARY OF THE INVENTION

An object of the present invention is to remedy the drawbacks of the prior art and to enable pairs of magnetoresistive elements to be provided that do not rely on using specific reference elements.

These objects are achieved by a magnetoresistive device comprising at least one pair of magnetoresistive elements comprising first and second magnetoresistive elements, each comprising at least a hard ferromagnetic layer that is trapped in a permanent direction and serves as a reference layer, and a soft ferromagnetic layer separated from the hard ferromagnetic layer by a separator layer, the soft layer being made for each of the first and second magnetoresistive elements in such a manner as to present two stable magnetic states, the device being characterized in that the first and second magnetoresistive elements of a pair of magnetoresistive elements are placed relative to each other in magnetostatic interaction in such a manner that a magnetic flux passing between the first and second elements closes through the soft ferromagnetic layers of the first and second elements, in that a write device is associated with each pair of magnetoresistive elements to control the magnetization of each soft layer, in that a read conductor line is associated with each first and second magnetoresistive element to detect the magnetic state of the soft layer by measuring the value of the corresponding magnetoresistance, and in that the soft ferromagnetic layers of the first and second magnetoresistive elements remain oriented so as to be substantially antiparallel relative to each other, whatever their stable state, while the hard ferromagnetic layers of the first and second magnetoresistive elements are oriented substantially in parallel.

Thus, in the present invention, a comparison is made between the resistances of two magnetoresistive elements that are continuously maintained in opposite resistance states (i.e. minimum/maximum or maximum/minimum). This is achieved by arranging these elements in such a manner that they are in magnetostatic interaction and can always remain in opposite magnetic configurations (i.e. presenting soft layer and trapped layer associations that are always in the parallel/antiparallel or antiparallel/parallel configuration for a pair of elements).

By associating two magnetoresistive elements that interact with each other in such a manner as to be always in opposite resistance states, i.e. if one is in the low resistance state, then the other is in the high resistance state, and vice versa, it is possible to achieve differential operation for the device based on the relative resistances of the two elements that are interacting.

The present invention implements this by using two magnetoresistive elements (tunnel junctions or spin valves) whose soft layers are in a flux closing configuration so that they remain oriented substantially antiparallel relative to each other, while the trapped layers are oriented in parallel by applying a strong initial magnetic field substantially parallel to the orientation axis of the magnetizations of the soft layers.

The basic elements of the invention are thus pairs of magnetoresistive elements (spin valves or magnetic tunnel junctions) in which the soft layers of the two elements are in magnetostatic interaction. This interaction is such that it maintains the magnetizations of the soft layers of each of the two elements approximately in antiparallel alignment while the magnetizations of the trapped layers are approximately parallel along the orientation axis of the magnetizations of the soft layers. Thus, when one element is in the parallel magnetic configuration, the other is in the antiparallel configuration, and vice versa. Furthermore, a write device is associated with the two magnetoresistive elements. The write device can be constituted by a write current line passing between the two magnetoresistive elements. When a current flows along said line, the current generates a magnetic field in opposite directions on the two magnetoresistive elements. By acting on the current direction, it is thus possible to cause the pair of magnetoresistive elements to switch over from a parallel/antiparallel configuration to an antiparallel/parallel configuration.

In a particular embodiment, the first and second magnetoresistive elements of a pair of magnetoresistive elements are constituted by C-shaped elements placed in a common plane so as to form essentially a ring, and so as to define between two airgaps.

In a first possible application, each of the first and second magnetoresistive elements defines a tunnel junction whose component layers pass an electric current flowing perpendicularly to the planes of said layers, and each read conductor line comprises a first conductor line segment connected to the bottom of a magnetoresistive element and a second conductor line segment connected to the top of the same magnetoresistive element, these conductor line segments being essentially perpendicular to the planes of the layers constituting the first and second magnetoresistive elements.

In another possible application, each of the first and second magnetoresistive elements defines a spin valve whose component layers carry an electric current traveling parallel to the planes of said layers, and each read conductor line associated with a magnetoresistive element comprises first and second conductor line segments connected respectively to the ends of said magnetoresistive element situated in the vicinity of said airgaps.

In a particular embodiment, the first and second magnetoresistive elements of a pair of magnetoresistive elements include an additional soft layer in common in the form of a continuous cylindrical ring of magnetization oriented along circular lines centered on the axis of said cylindrical ring, and first and second tunnel junctions disposed on one of the faces of the additional soft layer in diametrically opposite positions and perpendicularly to the plane of said additional soft layer, each of the first and second tunnel junctions comprising at least a soft ferromagnetic layer, an insulating separator layer, and a hard ferromagnetic layer carrying an electrical current perpendicularly to the planes of said layers.

In which case, advantageously, the read conductor lines associated with each of the first and second magnetoresistive elements comprise first conductor line segments connected respectively to the faces of the first and second tunnel junctions that are further from the additional soft layer, and a second conductor line segment in common connected to the face of the additional soft layer that is furthest from the first and second tunnel junctions.

According to an advantageous characteristic, the write device comprises a write line electrically insulated from the first and second magnetoresistive elements, and associated read lines, the write line being disposed centrally between the first and second magnetoresistive elements of a pair of magnetoresistive elements, perpendicularly to the plane of said magnetoresistive elements.

In a particular embodiment, the first and second magnetoresistive elements of a pair of magnetoresistive elements are disposed in different planes and are superposed in a manner that is essentially symmetrical relative to the write device which is itself interposed between the first and second magnetoresistive elements and parallel thereto.

In which case, more particularly, each of the first and second magnetoresistive elements defines a tunnel junction whose component layers carry an electric current flowing perpendicularly to the planes of said layers.

In another particular embodiment, the write device comprises firstly a central write line segment that is electrically insulated from the first and second magnetoresistive elements and associated read lines, the write segment being disposed centrally between the first and second magnetoresistive elements of a pair of magnetoresistive elements perpendicularly to the plane of said magnetoresistive elements, and secondly first and second additional write line segments that are parallel and interconnected by said central write line segment and that are disposed parallel to the first and second magnetoresistive elements on either side thereof, each of the first and second additional write line segments being superposed on both the first and the second magnetoresistive elements.

In yet another particular embodiment, each of the first and second magnetoresistive elements defines a tunnel junction whose component layers carry a current flowing perpendicularly to the planes of said layers, each read conductor line comprises a first conductor line segment connected to the bottom of a magnetoresistive element, and a second conductor line segment connected to the top of the same magnetoresistive elements, said conductor line segments being essentially perpendicular to the planes of the component layers of the first and second magnetoresistive elements, and the write device is constituted by write conductor lines each comprising at least one polarization layer situated in the vicinity of the corresponding magnetoresistive element beside the interface with the soft ferromagnetic layer.

BRIEF DESCRIPTION OF THE DRAWINGS

Other characteristics and advantages of the invention appear from the following description of particular embodiments given as examples, with reference to the accompanying drawings, in which.

DETAILED DESCRIPTION OF PARTICULAR EMBODIMENTS

Figure 1:
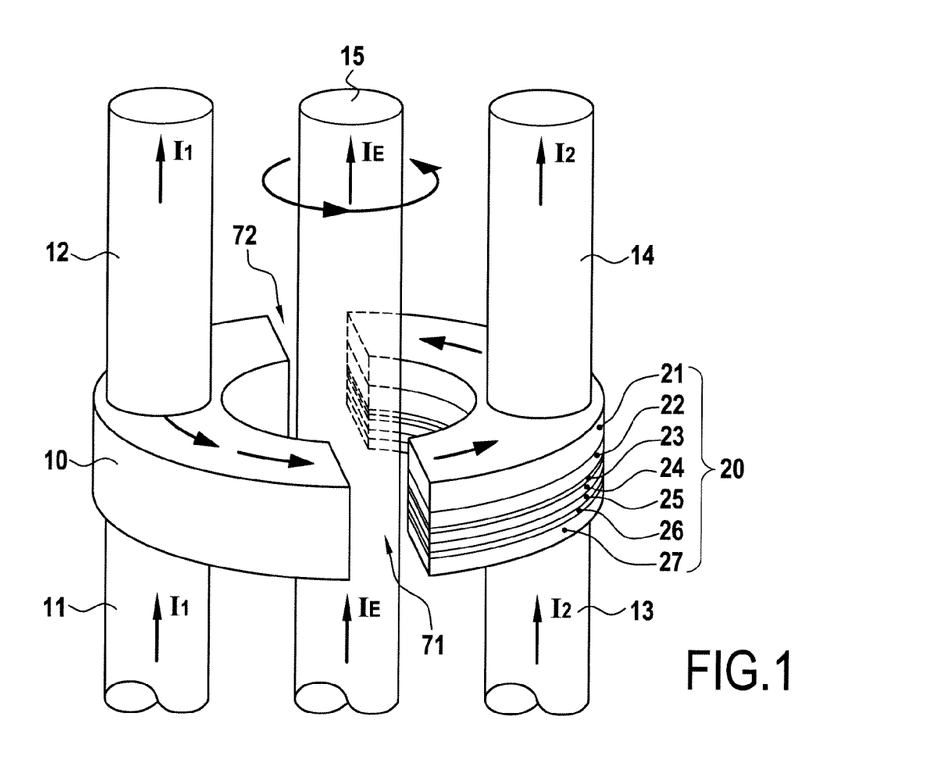
FIG. 1 is a diagrammatic perspective view of a magnetoresistive in a first embodiment of the invention.

FIG. 1 is a diagrammatic perspective view of a magnetoresistive device in a first embodiment of the invention.

In this first embodiment, there can be seen a pair of magnetoresistive elements 10, 20 situated in a common plane and lithographed and etched to have the shape of two C-shaped elements essentially constituting two cylindrical half-rings separated by two airgaps 71, 72.

In this example, each of the magnetoresistive elements 10, 20 constitutes a tunnel junction and comprises a stack of layers with at least a hard ferromagnetic layer that is trapped in a permanent direction and that serves as a reference layer, and a soft ferromagnetic layer separated from the hard ferromagnetic layer by a separator layer which in this example is an insulating layer.

Figure 1A:
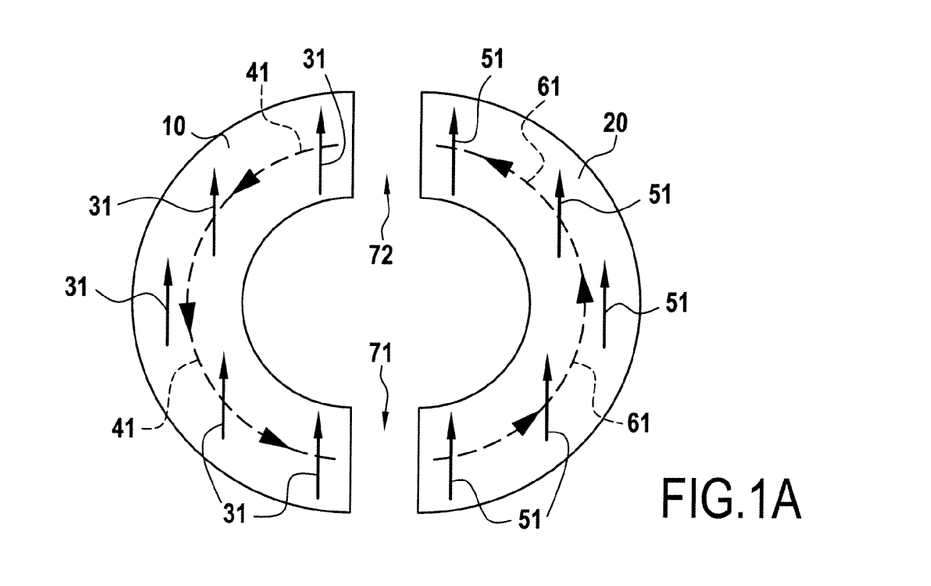
FIG. 1A is a diagrammatic plan view of the pair of magnetoresistive elements used in the FIG. 1 device.

The magnetizations of the soft layers of the two cylindrical half-rings 10, 20 are in a flux-closing configuration such that the magnetizations of the soft layers turn along the ring in the clockwise direction or in the opposite directions (arrows 41 and 61 in FIG. 1A).

As a result, on the two cylindrical half-rings, the magnetizations of the soft layers of the two magnetoresistive elements 10, 20 represented by the dashed line arrows 41, 61 are, on average, oriented in a manner that is substantially antiparallel.

For the two magnetoresistive elements 10, 20, the magnetizations of the trapped layers, as represented by continuous line arrows referenced 31, 51 in FIG. 1A were previously oriented to be parallel by annealing the structure in a saturating field at a temperature above the blocking temperature of an antiferromagnetic layer of IrMn (typically 250° C. at 1 Tesla (T)).

Thus, amongst the two magnetoresistive elements 10, 20, when one of the junctions is in a parallel configuration (as applies to the magnetoresistive element 20 in the example shown in FIG. 1A), the other is in an antiparallel configuration (the magnetoresistive element 10 in FIG. 1A), and vice versa.

Each of the two magnetoresistive elements 10 and 20 is connected at its bottom to a vertical segment of conductor line (or a via) referenced respectively 11, 13, and at its top to a vertical segment of conductor line (or a via) respectively referenced 12, 14. The conductor line segments 11 to 14, which may be made of copper or of aluminum, for example, carry respective measurement currents $I_1$ and $I_2$ serving to obtain on each read line 11, 12 or 13, 14 respectively, voltages that are proportional to the resistances of the tunnel junctions of the magnetoresistive elements 10 and 20 placed facing each other.

A write line 15 is constituted by a central metal conductor that passes vertically right through the structure of the magnetoresistive device along the axis of the cylinder defined by the two magnetoresistive elements 10, 20 in the form of half-rings. The write line 15 is electrically insulated from the tunnel junctions of the magnetoresistive elements 10, 20 and from the read lines 11, 12, 13, 14.

The conductor line 15 serves to write information in the tunnel junctions of the magnetoresistive elements 10, 20.

When a current of magnitude $I_E$ is conveyed by the conductor line 15 either upwards or downwards, said current generates a magnetic field having field lines that present cylindrical symmetry. By adjusting the current threshold so that the field created in the soft layers of the two tunnel junctions exceeds their coercive fields, it is possible to cause the magnetization of the two junctions to switch over, while keeping them always substantially antiparallel, the switchover taking place in a clockwise direction or in the opposite direction simultaneously for both magnetoresistive elements 10, 20.

FIG. 1 shows one possible example of a stack of layers 21 to 27 for the magnetoresistive element 20, the stack of layers serving to define a tunnel junction and suitable for being applied in the same manner to the magnetoresistive element 10.

Each tunnel junction can thus comprise a stack comprising in succession a 5 nanometer (nm) thick layer 27 of NiFe, a 1 nm thick layer 26 of CoFe, a 1.5 nm thick layer 25 of alumina, a 2.5 nm thick layer 24 of CoFe, a 0.7 nm thick layer 23 of Ru, a 2 nm thick layer 22 of CoFe, and an 8 nm thick layer 21 of IrMn.

The stack of layers 26 and 27 constitutes the soft ferromagnetic layer, the alumina layer 25 constitutes the insulating separator layer, and the layer 24 constitutes the hard ferromagnetic layer that serves as a reference layer.

As explained above, the embodiment of FIG. 1 applies to magnetoresistive elements 10, 20 constituted by tunnel junctions. With tunnel junctions, the electric current (read current $I_1$, $I_2$) passing through the magnetoresistive elements travels perpendicularly to the planes of the layers in the stack such as the layers 21 to 27. The conductor lines 11, 12 and 13, 14 for feeding current to the tunnel junctions are thus connected to the tops and the bottoms of the stacks, as shown in FIG. 1.

Figure 2:
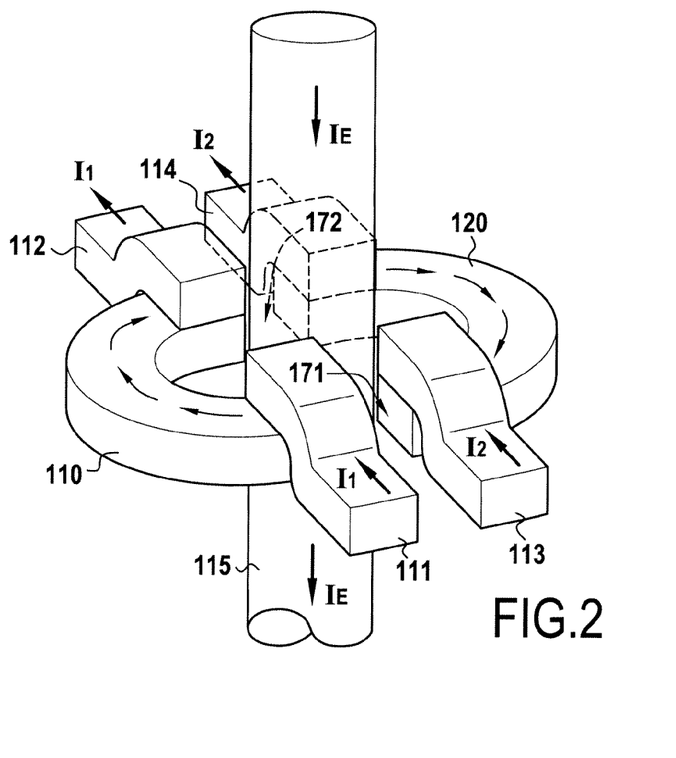
FIG. 2 is a diagrammatic perspective view of a magnetoresistive device in a second embodiment of the invention, making use of spin valves or other magnetoresistive elements functioning with planar current geometry.

FIG. 2 shows a second embodiment of the invention in which the magnetoresistive elements 110, 120 associated in a pair are constituted by metal spin valves or other analogous elements operating with planar current geometry.

These metal spin valves may present a composition that is very close to that of magnetic tunnel junctions. Thus, by way of example, the spin valves of the magnetoresistive elements 110, 120 can be made from a stack of layers 21 to 27 that is identical to that described with reference to FIG. 1, with the exception of the layer 25 separating the soft ferromagnetic layer 26, 27 (in this case a pair of layers comprising 5 nm of NiFe and 1 nm of CoFe). Thus, the separator layer 25 for the embodiment of FIG. 2 may be constituted by a 0.2 nm thick conductive layer of copper, replacing the 1.5 nm thick insulating layer of aluminum.

The magnetoresistive elements 110, 120 of FIG. 2 are placed relative to each other so as to interact magnetostatically in such a manner that a magnetic flux passing between these elements 110, 120 is looped through the soft ferromagnetic layers of these elements. The magnetoresistive elements 110, 120 can thus present a configuration comprising two cylindrical half-rings defining airgaps 171, 172, like the magnetoresistive elements 10, 20 of FIG. 1.

A write conductor line 115 can be disposed centrally in a manner analogous to the write line of FIG. 1 to carry a write current $I_E$ that creates a magnetic field in a manner analogous to that described above with reference to FIG. 1A.

Unlike tunnel junctions, in spin valves, the current does not flow perpendicularly to the planes of the layers constituting the corresponding magnetoresistive element, but instead flows parallel to said planes. The conductor lines for feeding the read currents $I_1$, $I_2$ to each of the magnetoresistive elements 110, 120 must then be situated at the two ends of each of said elements, in the vicinities of the airgaps 171, 172, as shown in FIG. 2. Each conductor line associated with a respective magnetoresistive element 110 or 120 thus comprises first and second line segments respectively referenced 111, 112 or 113, 114 that are connected to the ends of the corresponding magnetoresistive elements, in the vicinities of each of the airgaps 171, 172.

The embodiment of FIG. 2 can present advantages when it is desired to have a high level of robustness, since spin valves are relatively insensitive to electrostatic breakdown, or when it is desired to have magnetoresistance of an amplitude that does not vary as a function of bias voltage.

Nevertheless, tunnel junctions themselves present advantages because of the large amplitude of their magnetoresistance (tunnel magnetoresistance (TMR) which can typically be about 40%), while spin valves presenting planar current geometry present giant magnetoresistance (GMR) of about 10% to 15%.

Figure 3:
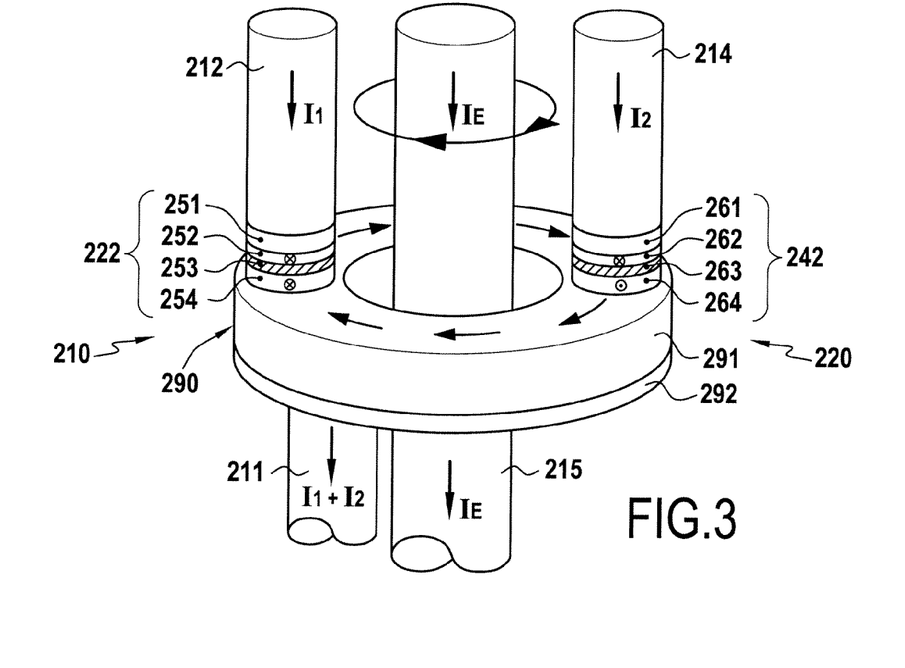
FIG. 3 is a diagrammatic perspective view of a magnetoresistive device in a third embodiment of the invention making use of tunnel junctions.

FIG. 3 shows another embodiment of the invention implementing a pair of tunnel junctions 222, 242.

In this embodiment, the magnetoresistive device comprises an additional soft layer 290 in the form of a continuous cylindrical ring, i.e. without any airgap, presenting magnetization that is oriented along circular lines centered on the axis of said cylindrical ring.

By way of example, the additional soft layer 290 may comprise a 5 nm thick layer 291 of NiFe deposited on a 5 nm thick buffer layer 292 of tantalum.

The magnetization of the soft layer 290 is oriented around the cylindrical ring in the clockwise direction or in the opposite direction.

The magnetoresistive device of FIG. 3 comprises first and second magnetoresistive elements 210, 220 comprising first and second tunnel junctions 222, 242 placed on the same face of the additional soft layer 290, in diametrically opposite locations and extending perpendicularly to the plane of said soft layer 290.

The tunnel junctions 222, 242 can be made by stacks of layers, analogous to the tunnel junctions 10, 20 of the embodiment in FIGS. 1 and 1A. Each of the tunnel junctions 222, 242 thus comprises at least: a soft ferromagnetic layer 254, 264; an insulating separator layer 253, 263; and a hard ferromagnetic layer 252, 262, which layers pass a current perpendicular to the planes of said layers.

The continuous soft layer 290 has its bottom connected to a metal line 211 serving to provide a common electrical connection to the underside of each of the two tunnel junctions 222, 242. On their top portions, the two tunnel junctions 222, 242 are electrically connected to two metal lines 212, 214 serving to convey the read currents $I_1$, $I_2$ through the two tunnel junctions 222, 242. The device has a central metal line 215 passing vertically along its axis serving to pass a write current $I_E$. The write current generates a field having cylindrical symmetry that is capable of causing the magnetization of the cylindrical soft layer 290 to switch over into one direction of rotation or the other around the cylindrical ring. The magnetizations of the soft layers 254, 264 of each of the two tunnel junctions 222, 242 (e.g. comprising 3 nm thick NiFe and 1 nm thick CoFe) are coupled together by exchange with the magnetization of the soft layer of the cylindrical ring 290, so these magnetizations are always in antiparallel alignment relative to each other. The magnetizations of the reference layers 251, 261 of the tunnel junctions 222, 242 are previously oriented to take up the same direction perpendicular to the diameter of the ring 290 interconnecting the two tunnel junctions 222, 242 (this can be done either by applying a saturating field in the planes of the layers, for trapped layers having high coercive field, or else by annealing under a field from the blocking temperature of the antiferromagnetic layer for layers that are trapped by exchange anisotropy). Since the reference magnetizations are parallel and since the magnetizations of the soft layers 254, 264 of the tunnel junctions 222, 242 are antiparallel, it is certain that the two tunnel junctions 222, 242 are in opposite resistance states.

Magnetoresistive elements 10, 20 and 110, 120 are described with reference to FIGS. 1 and 2 that are C-shaped, making up cylindrical half-rings that define between them two airgaps.

C-shaped magnetoresistive elements associating a soft magnetic layer and a trapped reference layer separated by a non-magnetic layer and passing a current where the current flow geometry is perpendicular to the planes of the layers (current perpendicular to the plane (CPP)), as in the embodiment of FIG. 1, or by a current that flows within the planes (current in plane (CIP)), as in the embodiment of FIG. 2 can be implemented in a variety of ways providing they are in a flux-closing configuration such that the magnetizations of their soft magnetic layers are substantially antiparallel while the magnetizations of their trapped layers are oriented to be parallel by an initialization stage (saturation in a strong field for a trapped layer having a strong coercive field, or annealing under a field for a trapped layer that operates by exchange anisotropy).

Figure 4A:
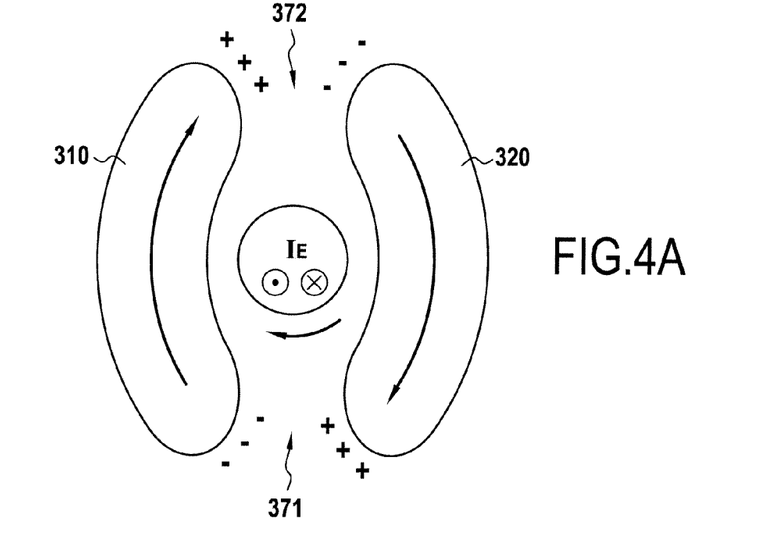
FIGS. 4A, 4B, and 4C are plan views of three particular examples of magnetoresistive element configurations that can be used in the context of the embodiments of FIGS. 1 and 2.
Figure 4B:
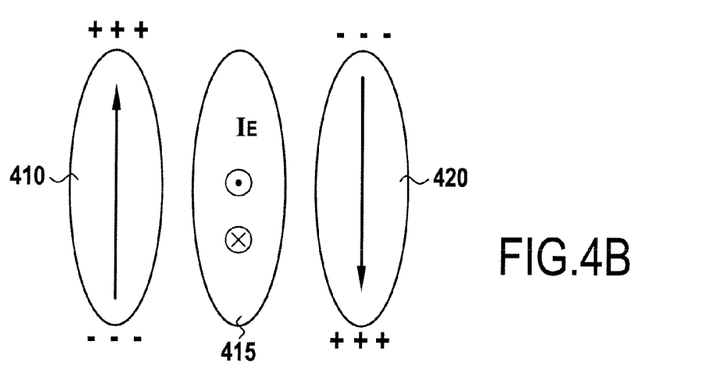
Figure 4C:
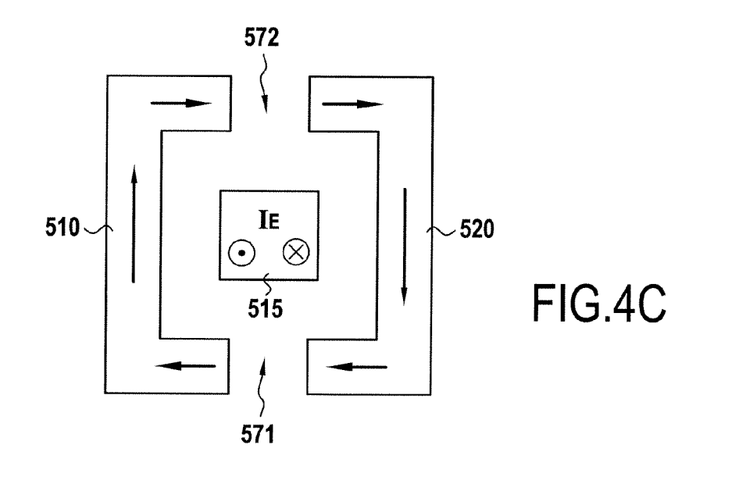

In FIGS. 4A to 4C, which show some possible variant embodiments, continuous arrows represent the magnetization directions of the soft layers in the magnetoresistive elements. The + and − signs represent the magnetostatic charges that appear at the ends of the magnetoresistive elements, and that couple together the facing elements in order to close the magnetic flux.

FIG. 4A shows magnetoresistive elements 310, 320 in the form of circular arcs defining two airgaps 371, 372 and surrounding a central write conductor 315 of circular section.

FIG. 4B shows two magnetoresistive elements 410, 420 in the form of ellipses placed parallel to each other on either side of a central write conductor 415 that is likewise elliptical in section.

FIG. 4C shows two magnetoresistive elements 510, 520 that are C-shaped, each presenting two end branches that are perpendicular to a central branch, and defining between the free ends of the end branches respective airgaps 571 and 572. The two C-shaped elements define essentially an outer rectangle and an inner rectangle. A central write conductor 515 of rectangular or square shape is placed in the center of the inner rectangular space defined by the magnetoresistive elements 510, 520.

A write current $I_E$ flows upwards or downwards along the central write conductor 315, 415, 515 for the purpose of causing the two magnetoresistive elements of a pair of elements 310 & 320, 410 & 420, or 510 & 520 to switch over from a parallel/antiparallel magnetic configuration to an antiparallel/parallel magnetic configuration, or vice versa. The terms parallel and antiparallel are used herein to specify the orientation of the soft layer relative to the trapped layer within each of the magnetoresistive elements.

In FIGS. 4A to 4C, the read current leads connected to the magnetoresistive elements are not shown.

These current leads are connected to the bottoms and the tops of magnetoresistive elements presenting CPP operation (tunnel junctions as in FIG. 1), or they are connected to the two ends of magnetoresistive elements as in FIG. 2 when the elements present CIP operation.

The dimensions of the elements shown in FIGS. 4A to 4C may be of the order of 90 nm to 1 micrometer (μm) depending on the desired density of integration and on the technology used for making the conductor lines and the magnetoresistive elements. These dimensions could also be a little smaller.

Devices of this type can be made by implementing the following technological steps. By way of example, the description below relates to a device in which the magnetoresistive elements present CPP operation.

Up to the level of the bottom plane of the magnetoresistive elements, the technology used can be "conventional" metal oxide on silicon (CMOS) technology up to a metal level n (n=3 or 4 or more as a function of the underlying control electronic circuits to which the device is to be connected, the level at which three conductor lines of Cu or Al emerge at the surface of the SiO$_2$ oxide, for example).

The following steps of magnetic microelectronics are then performed:
  depositing the magnetoresistive stacks;
  lithography and etching to produce the two magnetoresistive elements over the two conductive current-feed lines at the bottoms of the magnetoresistive elements; and
  providing the top three conductor lines connected firstly to the top portions of the two magnetoresistive elements, and secondly serving to extend the central conductor line for generating the magnetic field.

Figure 5:
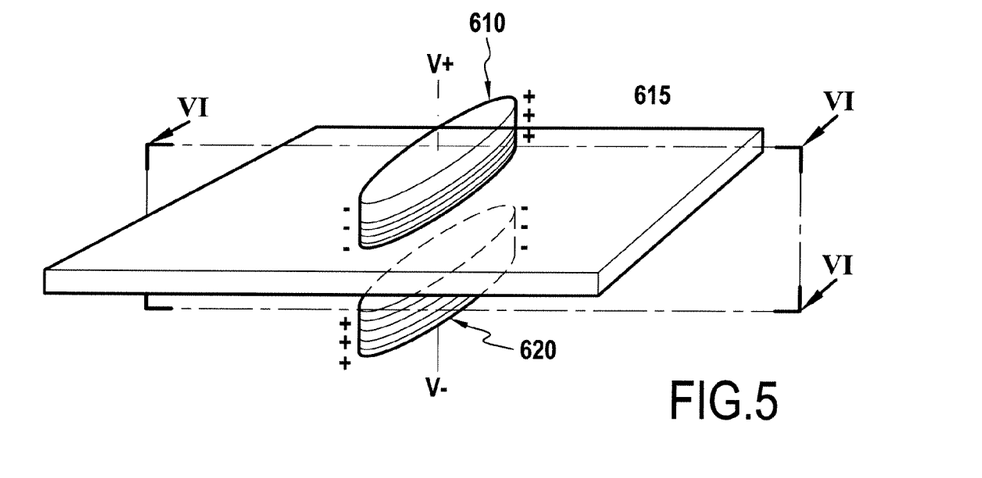
FIG. 5 is a diagrammatic perspective view of a magnetoresistive device constituting a fourth embodiment of the invention, making use of tunnel junctions.
Figure 6:
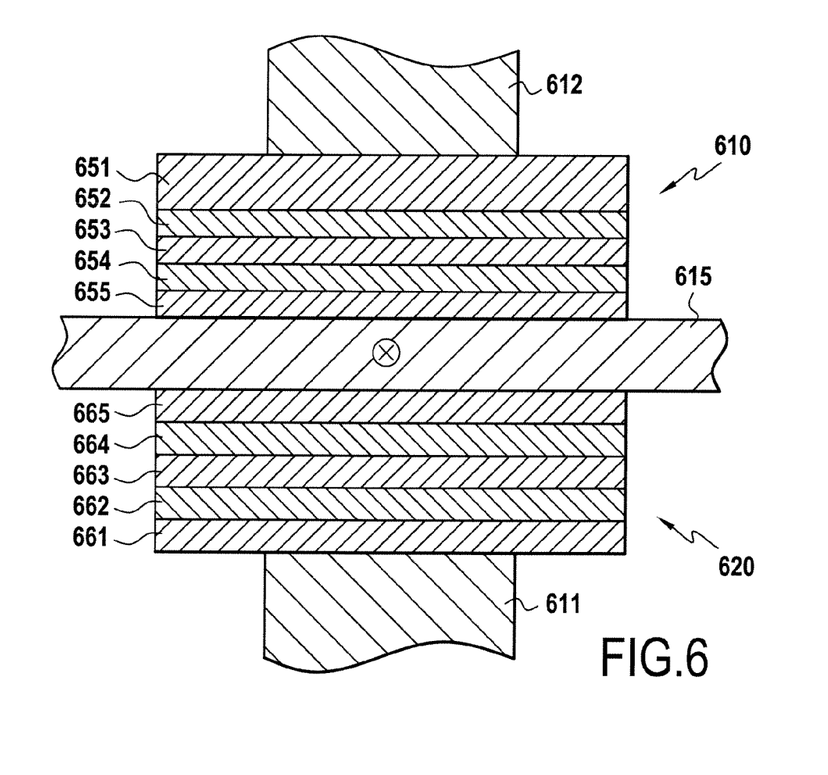
FIG. 6 is a section view on VI-VI of FIG. 5.

There follows a description with reference to FIGS. 5 and 6 of another embodiment of a magnetoresistive device of the invention, in which the two magnetoresistive elements 610, 620 are in a flux closure configuration without being constituted by elements that are C-shaped or the like, occupying a common plane and essentially forming a ring with two airgaps.

In the embodiment of FIGS. 5 and 6, a horizontal conductor such as conductor 615 is used to create the write magnetic field.

The magnetoresistive elements 610, 620 are themselves superposed on opposite sides of the conductor 615, the element 610 being placed on top of the magnetic field generating conductor 615 while the element 620 is placed under said conductor 615.

The horizontal conductor 615 thus carries a write current suitable for generating a magnetic field, with the directions of the field being opposite above and below the conductor 615.

For a configuration with CPP elements, such as tunnel junctions, and as shown in FIG. 5, the magnetoresistive elements 610, 620 are disposed substantially one above the other in a manner that is approximately symmetrical relative to the horizontal conductor 615. The elements 610, 620 are in a flux-closing configuration and the field created by the write current $I_E$ conveyed by the conductor 615 serves to cause the two elements 610, 620 to switch over from a parallel/antiparallel configuration to an antiparallel/parallel configuration depending on the sign of the write current $I_E$.

FIG. 6 shows an example of stacks of layers for making the magnetoresistive elements 610 and 620 of FIG. 5.

Each magnetoresistive element 610, 620 may comprise a respective conductor layer 651, 661 for connection with a respective conductor line 612, 611, a respective reference hard ferromagnetic layer 652, 662, e.g. made of IrMn, a respective CoFe layer 653, 663, a respective insulating alumina layer 654, 664, and a respective soft NiFe/CoFe layer 655, 665.

It is possible to optimize the magnetic write efficiency of the devices comprising two magnetoresistive elements in flux closure by combining horizontal and vertical conductors in order to produce the magnetic field. This is shown in FIG. 7.

The device comprises two magnetoresistive elements 710, 720 (shown here as being C-shaped elements operating in CPP and defining airgaps 771, 772) having their bottoms and tops connected to metal lines (711, 712, 713, 714). Furthermore, the magnetic field conductor 715 for switching over magnetization is made up of three portions: two horizontal portions 715A and 715C situated respectively on top and under both magnetoresistive elements 710, 720, and a central portion 715B interconnecting the horizontal portions 715A and 715C. The field created by the write current in the magnetoresistive element 710 is then mainly the sum of the field due to the conductor 715A plus the field due to the conductor 715B; the field generated in the magnetoresistive element 720 is the sum of the field created by the conductor 715C plus the field created by the conductor 715B.

Figure 7:
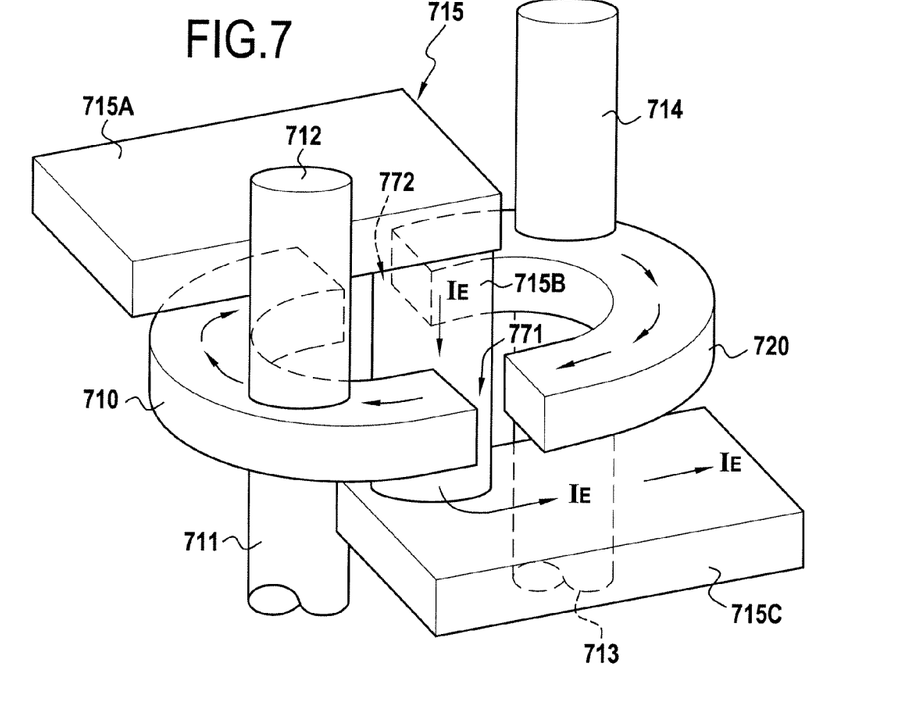
FIG. 7 is a diagrammatic perspective view of a magnetoresistive device in a fifth embodiment of the invention.

In FIG. 7, the magnetoresistive elements 710, 720 can themselves be made in the same manner as the elements 10, 20 of FIG. 1 when these elements 710, 720 operate in CPP.

The magnetoresistive elements 710, 720 of FIG. 7 could also operate in CIP, in which case they should be made in the same manner as the elements 110, 120 of FIG. 2. The read conductors 711, 712 and 713, 714 should then be made like the read conductors 111, 112 and 113, 114 of FIG. 2.

When using tunnel junctions, it is also possible to combine sending the write current $I_E$ via the write conductor 15, 215, 315, 415, 515, 715 with passing current through the magnetoresistive elements in order to assist writing by heating the soft layer of the tunnel junction and possibly taking advantage of spin transfer effects (torque exerted by polarized electrons passing through the tunnel junction). If this torque is itself sufficiently intense to cause the tunnel junctions to switch over, then the conductor for generating the magnetic field (15, 215, 315, 415, 515, 715) is not even necessary.

Figure 8:
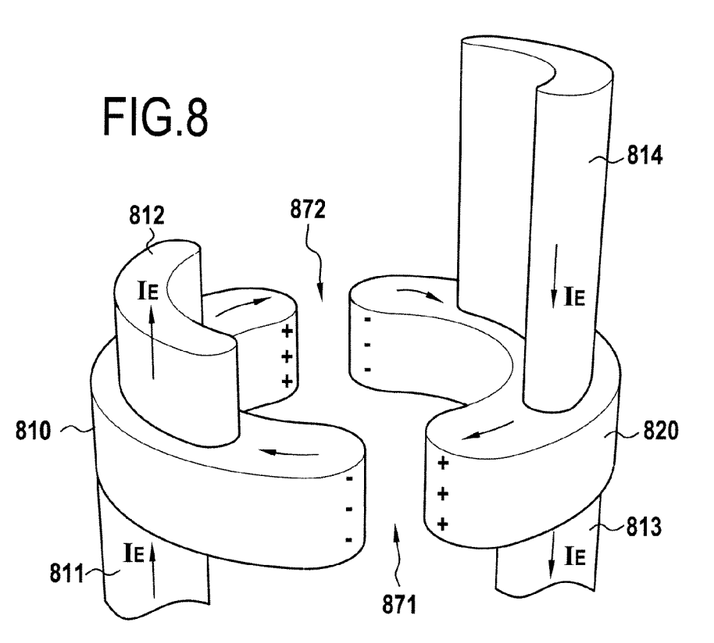
FIG. 8 is a diagrammatic perspective view of a magnetoresistive device in a sixth embodiment of the invention.

FIG. 8 shows a particular embodiment of a magnetoresistive device of the invention in which the write device is constituted by the read conductor lines 811, 812, 813, 814 each including at least one polarization layer 859 (FIG. 9) situated in the vicinity of the corresponding magnetoresistive element beside the interface with the soft ferromagnetic layer 855 to 857, so as to enable the coupled-together magnetoresistive elements 810, 820 to be switched over by spin transfer.

Since the year 2000, it has been known that it is possible to cause the magnetization of a magnetic nanostructure to switch over by passing a spin-polarized current through the nanostructure (see A. Katine et al., Phys. Rev. Lett, 84 (2000) 3149). In devices of the present invention, and providing the magnetoresistive elements 810, 820 that are used operate in a configuration where current flows perpendicularly to the interfaces (mainly magnetic tunnel junctions), this effect can thus be used to switch over the magnetizations of the soft layers of the two magnetoresistive elements that are in magnetostatic interaction.

In the example device shown in FIG. 8, which operates on this principle, the two magnetoresistive elements 810 and 820 are in magnetostatic interaction as in FIG. 1 and they define airgaps 871, 872.

Figure 9:
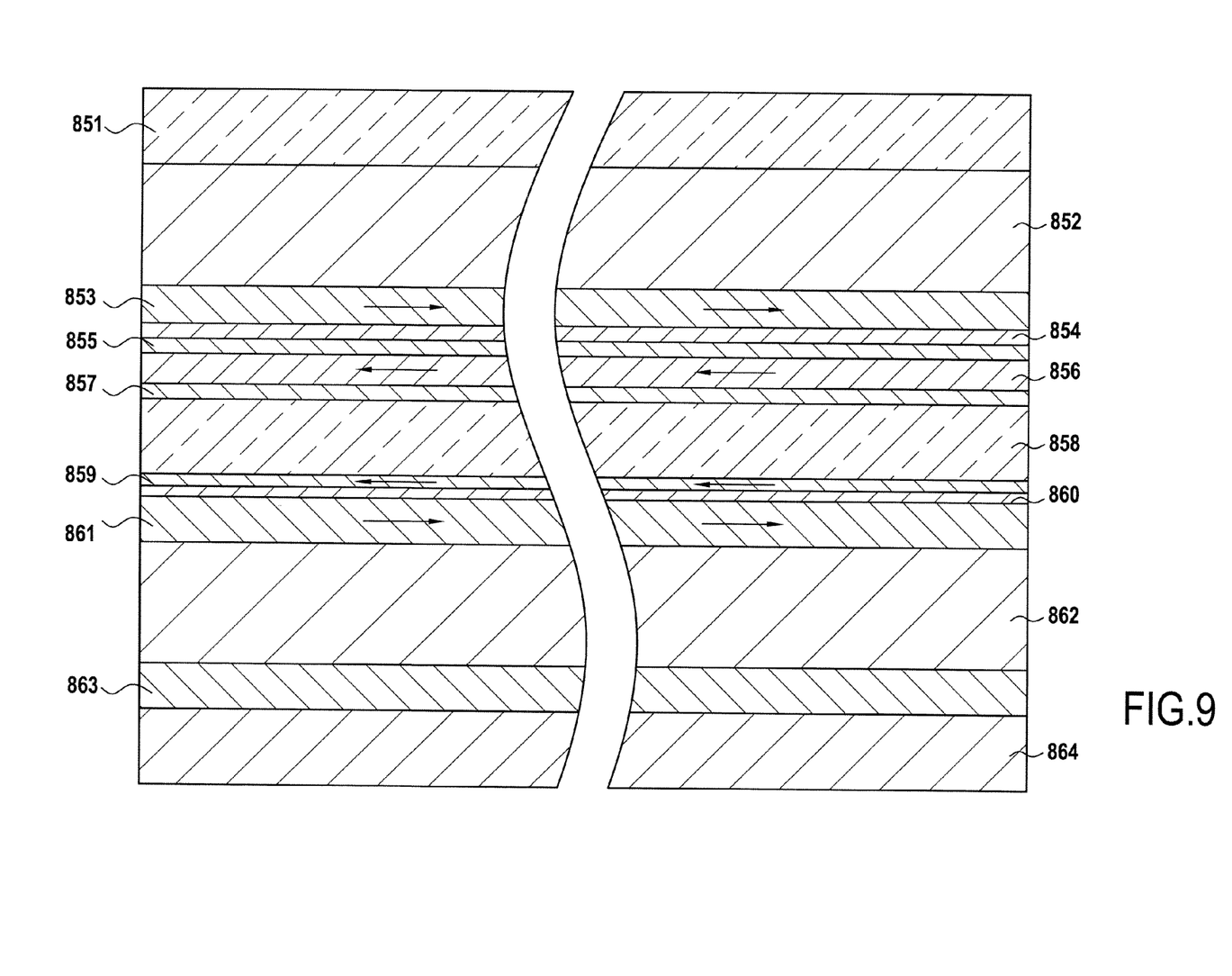
FIG. 9 is a section view showing an example of a magnetoresistive device associated with a polarizer suitable for use in the FIG. 8 embodiment.

In this case, the magnetoresistive stacks may advantageously have a composition of the kind shown in FIG. 9 comprising stacks of layer 864/863/862/861/860/859/858/857/856/855/854/853/852/851 having the following respective compositions:

5 nm of Ta/3 nm of NiFe/8 nm of IrMn/3 nm of CoFe/0.7 nm of Ru/(0.8 nm of CoFe/0.3 nm of Cu)$_2$/0.8 nm of CoFe/5 nm of Cu/1 nm of CoFe/2 nm of NiFe/1 nm of CoFe/1 nm of Al$_2$O$_3$/2.5 nm of CoFe/8 nm of IrMn/10 nm of Cu.

The stack thus comprises a tunnel junction constituted by an alumina tunnel barrier 854 separating a reference layer 853 presenting magnetization that is trapped by exchange anisotropy (interaction with a layer 852 comprising an antiferromagnetic material such as 8 nm of IrMn) of a soft magnetic layer 855 to 857 (with a layer 856 of doped NiFe at the CoFe interfaces 855, 857 in order to increase the polarization of electrons in the vicinity of the tunnel barrier and avoid inter-diffusion with the copper layer 858 at the interface remote from the barrier). This tunnel junction is associated with a layer 859 for spin polarizing the current passing through this stack perpendicularly to the interfaces. This polarization layer 859 may be constituted by a fine layer of CoFe laminated by ultrafine layers of Cu (typical composition (0.8 nm of CoFe/0.3 nm of Cu)$_2$/0.8 nm of CoFe). The purpose of lamination is to take advantage of the highly asymmetrical diffusion at the CoFe/Cu interfaces so as to obtain the maximum possible polarization. This polarization layer is coupled antiparallel to a 3 nm layer 861 of CoFe. This antiparallel coupling is provided by an antiferromagnetic interaction that exists through the Ru layer 860 for thicknesses of Ru lying typically in the range 0.5 nm to 0.9 nm. The CoFe layer 861 is itself trapped by exchange anisotropy (coupling with an 8 nm thick antiferromagnetic layer 862 of IrMn). By performing annealing above the blocking temperature of the antiferromagnetic layers and by cooling under a saturated field, it is possible to ensure that the magnetizations of the two layers trapped by exchange anisotropy are parallel. Under such circumstances, the reference layer 853 and the polarization layer 859 are in a weak field with antiparallel magnetizations.

On writing, the advantage of such a structure is that when a write current $I_E$ applied to the conductors 811, 812 and 813, 814 passes through the structure upwards or downwards, the spin transfer effects produced by the reference layer 853 and the polarization layer 859 add together in the soft layer 855 to 857 of the tunnel junction (see for example L. Berger, Journ. Appl. Phys., 93 (2003) 7693). Typical current densities for switching over in this kind of structure are of the order of $10^6$ amps per square centimeter (A/cm$^2$) to $10^7$ A/cm$^2$, thus giving currents of 0.1 milliamps (mA) to 1 mA for structures presenting dimensions of 100 nm×100 nm.

On reading, a weaker current is delivered by the same conductors 811, 812 or 813, 814, respectively, through the structure so as to be sensitive to the resistance level of the structure of magnetoresistive elements 810, 820, but without causing it to switch over. It is important to observe that the resistance of such a structure is dominated entirely by the tunnel barrier. Consequently, the magnetoresistance of the supports comes solely from the relative orientation of the magnetizations of the soft layer and of the trapped layer on either side of the tunnel barrier.

In this stack, it might be possible to omit the polarization layer and the layers of Ru, CoFe, and IrMn 861 to 863 associated therewith for trapping the polarization layer 859. However the spin transfer effect on the soft layer 855 to 857 would then come solely from the reference layer 853 and would therefore be smaller. It would then be necessary to use higher current densities when reading which would make it necessary to work with junctions of lower resistance (since the junctions are voltage limited by electric breakdown), and that would lead to higher consumption of electricity.

In the FIG. 8 device, the two magnetoresistive elements 810 and 820 can be constituted by the stack shown in FIG. 9. Writing is then performed by sending current pulses $I_E$ in opposite directions through the two elements 810, 820 so as to cause the magnetizations of the soft layers 855 to 857 to switch over in two opposite directions. By acting on the directions of the current pulses $I_E$ through each of the two elements 810, 820, it is thus possible to cause the pair of elements 810, 820 to switch from parallel/antiparallel to antiparallel/parallel, where the concepts of parallel and antiparallel are relative to the orientations of the magnetizations of the reference layer 853 and of the top layers 855-857.

In the magnetoresistive device of the invention, the magnetic field acting on the two magnetoresistive elements of a pair of magnetoresistive elements can also be generated from a vertical conductor, a horizontal conductor, or a combination of a vertical conductor and a horizontal conductor.

As explained with reference with FIGS. 8 and 9, a magnetoresistive device based on magnetoresistive elements using current flowing perpendicularly to the planes of the layers making up the magnetoresistive elements can operate without a conductor for generating a magnetic field, with magnetic switching then relying entirely on the spin transfer effect.

The invention claimed is:

1. A magnetoresistive device comprising at least one pair of magnetoresistive elements comprising first and second magnetoresistive elements, each comprising at least a hard ferromagnetic layer that is trapped in a permanent direction and serves as a reference layer, and a soft ferromagnetic layer separated from the hard ferromagnetic layer by a separator layer, the soft layer being made for each of the first and second magnetoresistive elements in such a manner as to present two stable magnetic states, the device being characterized in that the first and second magnetoresistive elements of a pair of magnetoresistive elements are placed relative to each other in magnetostatic interaction in such a manner that a magnetic flux passing between the first and second elements closes through the soft ferromagnetic layers of the first and second elements, in that a write device is associated with each pair of magnetoresistive elements to control the magnetization of each soft layer, in that a read conductor line is associated with each first and second magnetoresistive element to detect the magnetic state of the soft layer by measuring the value of the corresponding magnetoresistance, in that the soft ferromagnetic layers of the first and second magnetoresistive elements remain oriented so as to be substantially antiparallel relative to each other, whatever their stable state, while the hard ferromagnetic layers of the first and second magnetoresistive elements are oriented substantially in parallel;

in that each of the first and second magnetoresistive elements defines a tunnel junction whose component layers pass an electric current flowing perpendicularly to the planes of said layers, and in that each read conductor line comprises a first conductor line segment connected to the bottom of a magnetoresistive element and a second conductor line segment connected to the top of the same magnetoresistive element, these conductor line segments being essentially perpendicular to the planes of the layers constituting the first and second magnetoresistive elements.

2. A magnetoresistive device according to claim 1, characterized in that the first and second magnetoresistive elements of a pair of magnetoresistive elements are constituted by C-shaped elements placed in a common plane so as to form essentially a ring, and so as to define between them two airgaps.

3. A magnetoresistive device according to claim 1, characterized in that the first and second magnetoresistive elements of a pair of magnetoresistive elements include an additional soft layer in common in the form of a continuous cylindrical ring of magnetization oriented along circular lines centered on the axis of said cylindrical ring, and first and second tunnel junctions disposed on one of the faces of the additional soft layer in diametrically opposite positions and perpendicularly to the plane of said additional soft layer, each of the first and second tunnel junctions comprising at least a soft ferromagnetic layer, an insulating separator layer, and a hard ferromagnetic layer carrying an electrical current perpendicularly to the planes of said layers.

4. A magnetoresistive device according to claim 3, characterized in that the read conductor lines associated with each of the first and second magnetoresistive elements comprise first conductor line segments connected respectively to the faces of the first and second tunnel junctions that are further from the additional soft layer, and a second conductor line segment in common connected to the face of the additional soft layer that is furthest from the first and second tunnel junctions.

5. A magnetoresistive device according to claim 1, characterized in that the write device comprises a write line electrically insulated from the first and second magnetoresistive elements, and associated read lines, the write line being disposed centrally between the first and second magnetoresistive elements of a pair of magnetoresistive elements, perpendicularly to the plane of said magnetoresistive elements.

6. A magnetoresistive device according to claim 1, characterized in that the first and second magnetoresistive elements of a pair of magnetoresistive elements are disposed in different planes and are superposed in a manner that is essentially symmetrical relative to the write device, which is itself interposed between the first and second magnetoresistive elements and parallel thereto.

7. A magnetoresistive device according to claim 1, characterized in that the write device comprises firstly a central write line segment that is electrically insulated from the first and second magnetoresistive elements and associated read lines, the write segment being disposed centrally between the first and second magnetoresistive elements of a pair of magnetoresistive elements perpendicularly to the plane of said magnetoresistive elements, and secondly first and second additional write line segments that are parallel and interconnected by said central write line segment and that are disposed parallel to the first and second magnetoresistive elements on either side thereof, each of the first and second additional write line segments being superposed on both the first and the second magnetoresistive elements.

8. A magnetoresistive device according to claim 1, characterized in that the write device is constituted by write conductor lines, writing in a tunnel junction being obtained by spin transfer between the current (IE) applied to the write conductor lines and the magnetization of the soft layer of the tunnel junction.

9. A magnetoresistive device according to claim 8, characterized in that each write conductor line comprises at least one polarization layer situated in the vicinity of the corresponding magnetoresistive element beside the interface with the soft ferromagnetic layer opposite the tunnel barrier, in that the magnetization of this polarization layer is essentially opposed to the magnetization of the reference layer of the tunnel junction and in that the polarization layer is separated from the soft layer by a non magnetic metallic separating layer.

10. A magnetoresistive device according to claim 9, characterized in that the non magnetic metallic separating layer is a copper layer.

11. A magnetoresistive device according to claim 2, characterized in that the write device comprises a write line electrically insulated from the first and second magnetoresistive elements, and associated read lines, the write line being disposed centrally between the first and second magnetoresistive elements of a pair of magnetoresistive elements, perpendicularly to the plane of said magnetoresistive elements.

12. A magnetoresistive device according to claim 3, characterized in that the write device comprises a write line electrically insulated from the first and second magnetoresistive elements, and associated read lines, the write line being disposed centrally between the first and second magnetoresistive elements of a pair of magnetoresistive elements, perpendicularly to the plane of said magnetoresistive elements.

13. A magnetoresistive device according to claim 4, characterized in that the write device comprises a write line electrically insulated from the first and second magnetoresistive elements, and associated read lines, the write line being disposed centrally between the first and second magnetoresistive elements of a pair of magnetoresistive elements, perpendicularly to the plane of said magnetoresistive elements.

14. A magnetoresistive device comprising at least one pair of magnetoresistive elements comprising first and second magnetoresistive elements, each comprising at least a hard ferromagnetic layer that is trapped in a permanent direction and serves as a reference layer, and a soft ferromagnetic layer separated from the hard ferromagnetic layer by a separator layer, the soft layer being made for each of the first and second magnetoresistive elements in such a manner as to present two stable magnetic states, the device being characterized in that the first and second magnetoresistive elements of a pair of magnetoresistive elements are constituted by C-shaped elements placed in a common plane so as to form essentially a ring and so as to define between them two airgaps and are placed relative to each other in magnetostatic interaction in such a manner that a magnetic flux passing between the first and second elements closes through the soft ferromagnetic layers of the first and second elements, in that a write device is associated with each pair of magnetoresistive elements to control the magnetization of each soft layer, and, comprises firstly a central write line segment that is electrically insulated from the first and second magnetoresistive elements and associated read lines, the write segment being disposed centrally between the first and second magnetoresistive elements of a pair of magnetoresistive elements perpendicularly to the plane of said magnetoresistive elements, and secondly first and second additional write line segments that are parallel and interconnected by said central write line segment and that are disposed parallel to the first and second magnetoresistive elements on either side thereof, each of the first and second additional write line segments being superposed on both the first and the second magnetoresistive elements;

in that a read conductor line is associated with each first and second magnetoresistive element to detect the magnetic state of the soft layer by measuring the value of the corresponding magnetoresistance, in that the soft ferromagnetic layers of the first and second magnetoresistive elements remain oriented so as to be substantially antiparallel relative to each other, whatever their stable state, while the hard ferromagnetic layers of the first and second magnetoresistive elements are oriented substantially in parallel;

in that each of the first and second magnetoresistive elements defines a tunnel junction whose component layers pass an electric current flowing perpendicularly to the planes of said layers, and in that each read conductor line comprises a first conductor line segment connected to the bottom of a magnetoresistive element and a second conductor line segment connected to the top of the same magnetoresistive element, these conductor line segments being essentially perpendicular to the planes of the layers constituting the first and second magnetoresistive elements.

15. A magnetoresistive device comprising at least one pair of magnetoresistive elements comprising first and second magnetoresistive elements, each comprising at least a hard ferromagnetic layer that is trapped in a permanent direction and serves as a reference layer, and a soft ferromagnetic layer separated from the hard ferromagnetic layer by a separator layer, the soft layer being made for each of the first and second magnetoresistive elements in such a manner as to present two stable magnetic states, the device being characterized in that the first and second magnetoresistive elements of a pair of magnetoresistive elements include an additional soft layer in common in the form of a continuous cylindrical ring of magnetization oriented along circular lines centered on the axis of said cylindrical ring, and first and second tunnel junctions disposed on one of the faces of the additional soft layer in diametrically opposite positions and perpendicularly to the plane of said additional soft layer, each of the first and second tunnel junctions comprising at least a soft ferromagnetic layer, an insulating separator layer, and a hard ferromagnetic layer carrying an electrical current perpendicularly to the planes of said layers; and are placed relative to each other in magnetostatic interaction in such a manner that a magnetic flux passing between the first and second elements closes through the soft ferromagnetic layers of the first and second elements, in that a write device comprises firstly a central write line segment that is electrically insulated from the first and second magnetoresistive elements and associated read lines, the write segment being disposed centrally between the first and second magnetoresistive elements of a pair of magnetoresistive elements perpendicularly to the plane of said magnetoresistive elements, and secondly first and second additional write line segments that are parallel and interconnected by said central write line segment and that are disposed parallel to the first and second magnetoresistive elements on either side thereof, each of the first and second additional write line segments being superposed on both the first and the second magnetoresistive elements; and is associated with each pair of magnetoresistive elements to control the magnetization of each soft layer, in that a read conductor line is associated with each first and second magnetoresistive element to detect the magnetic state of the soft layer by measuring the value of the corresponding magnetoresistance, in that the soft ferromagnetic layers of the first and second magnetoresistive elements remain oriented so as to be substantially antiparallel relative to each other, whatever their stable state, while the hard ferromagnetic layers of the first and second magnetoresistive elements are oriented substantially in parallel, in that each of the first and second magnetoresistive elements defines a tunnel junction whose component layers pass an electric current flowing perpendicularly to the planes of said layers, and in that each read conductor line comprises a first conductor line segment connected to the bottom of a magnetoresistive element and a second conductor line segment connected to the top of the same magnetoresistive element, these conductor line segments being essentially perpendicular to the planes of the layers constituting the first and second magnetoresistive elements.

16. A magnetoresistive device comprising at least one pair of magnetoresistive elements comprising first and second magnetoresistive elements, each comprising at least a hard ferromagnetic layer that is trapped in a permanent direction and serves as a reference layer, and a soft ferromagnetic layer separated from the hard ferromagnetic layer by a separator layer, the soft layer being made for each of the first and second magnetoresistive elements in such a manner as to present two stable magnetic states, the device being characterized in that the first and second magnetoresistive elements of a pair of magnetoresistive elements include an additional soft layer in common in the form of a continuous cylindrical ring of magnetization oriented along circular lines centered on the axis of said cylindrical ring, and first and second tunnel junctions disposed on one of the faces of the additional soft layer in diametrically opposite positions and perpendicularly to the plane of said additional soft layer, each of the first and second tunnel junctions comprising at least a soft ferromagnetic layer, an insulating separator layer, and a hard ferromagnetic layer carrying an electrical current perpendicularly to the planes of said layers; and are placed relative to each other in magnetostatic interaction in such a manner that a magnetic flux passing between the first and second elements closes through the soft ferromagnetic layers of the first and second elements, the first and second magnetoresistive elements of a pair of magnetoresistive elements comprising first conductor line segments connected respectively to the faces of the first and second tunnel junctions that are further from the additional soft layer, and a second conductor line segment in common connected to the face of the additional soft layer that is furthest from the first and second tunnel junctions;

in that a write device is associated with each pair of magnetoresistive elements to control the magnetization of each soft layer, in that a read conductor line is associated with each first and second magnetoresistive element to detect the magnetic state of the soft layer by measuring the value of the corresponding magnetoresistance, in that the soft ferromagnetic layers of the first and second magnetoresistive elements remain oriented so as to be substantially antiparallel relative to each other, whatever their stable state, while the hard ferromagnetic layers of the first and second magnetoresistive elements are oriented substantially in parallel; and the write device comprises firstly a central write line segment that is electrically insulated from the first and second magnetoresistive elements and associated read lines, the write segment being disposed centrally between the first and second magnetoresistive elements of a pair of magnetoresistive elements perpendicularly to the plane of said magnetoresistive elements, and secondly first and second additional write line segments that are parallel and interconnected by said central write line segment and that are disposed parallel to the first and second magnetoresistive elements on either side thereof, each of the first and second additional write line segments being superposed on both the first and the second magnetoresistive elements;

in that each of the first and second magnetoresistive elements defines a tunnel junction whose component layers pass an electric current flowing perpendicularly to the planes of said layers, and in that each read conductor line comprises a first conductor line segment connected to the bottom of a magnetoresistive element and a second conductor line segment connected to the top of the same magnetoresistive element, these conductor line segments being essentially perpendicular to the planes of the layers constituting the first and second magnetoresistive elements.

17. A magnetoresistive device according to claim 2, characterized in that the write device is constituted by write conductor lines, writing in a tunnel junction being obtained by spin transfer between the current (IE) applied to the write conductor lines and the magnetization of the soft layer of the tunnel junction.

18. A magnetoresistive device according to claim 17, characterized in that each write conductor line comprises at least one polarization layer situated in the vicinity of the corresponding magnetoresistive element beside the interface with the soft ferromagnetic layer opposite the tunnel barrier, in that the magnetization of this polarization layer is essentially opposed to the magnetization of the reference layer of the tunnel junction and in that the polarization layer is separated from the soft layer by a non magnetic metallic separating layer.

19. A magnetoresistive device according to claim 18, characterized in that the non magnetic metallic separating layer is a copper layer.

* * * * *